(12) United States Patent
Costello

(10) Patent No.: US 10,684,436 B2
(45) Date of Patent: Jun. 16, 2020

(54) COMMUNICATION SYSTEM HAVING A PANEL MOUNT CONNECTOR ASSEMBLY

(71) Applicant: TE CONNECTIVITY CORPORATION, Berwyn, PA (US)

(72) Inventor: Brian Patrick Costello, Scotts Valley, CA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/048,846

(22) Filed: Jul. 30, 2018

(65) Prior Publication Data

US 2020/0033544 A1 Jan. 30, 2020

(51) Int. Cl.
| | |
|---|---|
| *G02B 6/38* | (2006.01) |
| *G02B 6/44* | (2006.01) |
| *G02B 6/42* | (2006.01) |
| *H04Q 1/02* | (2006.01) |
| *H01R 13/58* | (2006.01) |
| *H01R 13/631* | (2006.01) |
| *H01R 13/74* | (2006.01) |

(52) U.S. Cl.
CPC ......... *G02B 6/4452* (2013.01); *G02B 6/3821* (2013.01); *G02B 6/423* (2013.01); *G02B 6/4292* (2013.01); *H04Q 1/09* (2013.01); *H01R 13/5833* (2013.01); *H01R 13/6315* (2013.01); *H01R 13/74* (2013.01)

(58) Field of Classification Search
CPC .................................................. G02B 6/3821
See application file for complete search history.

(56) References Cited

U.S. PATENT DOCUMENTS

| | | | |
|---|---|---|---|
| 8,395,046 B2* | 3/2013 | Nicewicz | H02B 1/202 174/17 R |
| 9,155,214 B2 | 10/2015 | Ritter et al. | |
| 9,354,399 B2* | 5/2016 | Waldron | G02B 6/38 |
| 2004/0017983 A1* | 1/2004 | Chen | G02B 6/3821 385/78 |
| 2014/0133807 A1* | 5/2014 | Katoh | G02B 6/3821 385/78 |
| 2016/0139344 A1* | 5/2016 | de los Santos Campos | G02B 6/3869 385/78 |

* cited by examiner

*Primary Examiner* — Charlie Y Peng

(57) ABSTRACT

A panel mount connector assembly includes a panel mount bracket having a cavity with a front opening. The assembly includes a connector movably received in the cavity holding contacts at a mating end and cables extending from a cable end. The assembly includes a biasing mechanism received in the cavity engaging the connector and forward biasing the connector in the cavity. The biasing mechanism has a biasing force exceeding a mating force with the mating connector such that the connector remains forward biased in the cavity during mating with the mating connector. The biasing mechanism allows the connector to move rearward when the biasing force is exceeded.

20 Claims, 13 Drawing Sheets

COMMUNICATION SYSTEM HAVING A PANEL MOUNT CONNECTOR ASSEMBLY

BACKGROUND OF THE INVENTION

The subject matter herein relates generally to panel mount connector assemblies for communication systems.

Communication systems are used in various applications, such as part of a data center, switch, router, server, hub, network, or storage system. The components of the communication system are typically arranged in a rack having horizontal shelves arranged within the rack holding the components, such as switches, servers, and the like. The components are connected by cable connectors and cables between the various components in the rack or in another rack.

Conventional communication systems are designed such that the connectors have a working or mating range to accommodate system tolerances. For example, the maximum mating depth is designed at a depth where the connectors are fully mate and the minimum mating depth is at a mating depth where the connectors are slightly unmated but the contacts of the connectors are electrically connected. However, electrical performance degrades when the connectors are not fully mated. Additionally, providing longer electrical contacts to increase the mating depth range adds size and cost to the system and leads to poorer electrical performance due to electrical stubs created from the long overlapping areas of the electrical contacts. The electrical connectors are rigidly mounted in the system and are at risk of being damaged or dislodged from the rack if the connectors are over mated, such as being pressed further than the designed maximum mating depth.

A need remains for electrical connectors for a communication system having a large mating range.

BRIEF DESCRIPTION OF THE INVENTION

In one embodiment, a panel mount connector assembly is provided including a panel mount bracket extending between a front and a rear. The panel mount bracket has a cavity open at the rear and a front opening at the front open to the cavity. The panel mount bracket has a shoulder adjacent the front opening. The panel mount connector assembly includes a connector movably received in the cavity. The connector has a mating end and a cable end. The connector holds contacts at the mating end and has cables terminated to the contacts extending rearward from the cable end. The contacts are configured to be mated with a mating connector plugged into the connector at the mating end. The connector has an end wall in the cavity facing the shoulder. The panel mount connector assembly includes a biasing mechanism received in the cavity engaging the connector and forward biasing the connector in the cavity. The biasing mechanism has a biasing force exceeding a mating force with the mating connector such that the connector remains forward biased in the cavity during mating with the mating connector. The biasing mechanism allows the connector to move rearward when the biasing force is exceeded.

In another embodiment, a cable assembly is provided including a cable bundle having a plurality of cables, a first panel mount connector assembly terminated to corresponding cables of the cable bundle and configured to be coupled to a first panel and a second panel mount connector assembly terminated to corresponding cables of the cable bundle and configured to be coupled to a second panel. The first panel mount connector assembly includes a panel mount bracket extending between a front and a rear. The panel mount bracket has a cavity open at the rear and a front opening at the front open to the cavity. The panel mount bracket has a shoulder adjacent the front opening. The panel mount bracket is configured to be mounted to the panel. The panel mount connector assembly includes a connector movably received in the cavity. The connector has a mating end and a cable end. The connector holds contacts at the mating end and has cables terminated to the contacts extending rearward from the cable end. The contacts are configured to be mated with a mating connector plugged into the connector at the mating end. The connector has an end wall in the cavity facing the shoulder. The panel mount connector assembly includes a biasing mechanism received in the cavity engaging the connector and forward biasing the connector in the cavity. The biasing mechanism has a biasing force exceeding a mating force with the mating connector such that the connector remains forward biased in the cavity during mating with the mating connector. The biasing mechanism allows the connector to move rearward when the biasing force is exceeded.

In a further embodiment, a communication system is provided including a rack having a plurality of shelves coupled to the rack and servers coupled to corresponding shelves. Each shelf has a rear panel including a panel cutout and a panel mount connector assembly received in the panel cutout can coupled to the rear panel. The panel mount connector assembly includes a panel mount bracket extending between a front and a rear. The panel mount bracket has a cavity open at the rear and a front opening at the front open to the cavity. The panel mount bracket has a shoulder adjacent the front opening. The panel mount bracket is configured to be mounted to the panel. The panel mount connector assembly includes a connector movably received in the cavity. The connector has a mating end and a cable end. The connector holds contacts at the mating end and has cables terminated to the contacts extending rearward from the cable end. The connector has an end wall in the cavity facing the shoulder. The panel mount connector assembly includes a biasing mechanism received in the cavity engaging the connector and forward biasing the connector in the cavity. Each server has a server host board and a mating connector electrically connected to the server host board. The mating connector is mated to the connector of the corresponding panel mount connector assembly when the server is coupled to the shelf. The biasing mechanism has a biasing force exceeding a mating force with the mating connector such that the connector remains forward biased in the cavity during mating with the mating connector. The biasing mechanism allows the connector to move rearward when the biasing force is exceeded.

DETAILED DESCRIPTION OF THE INVENTION

Figure 1:
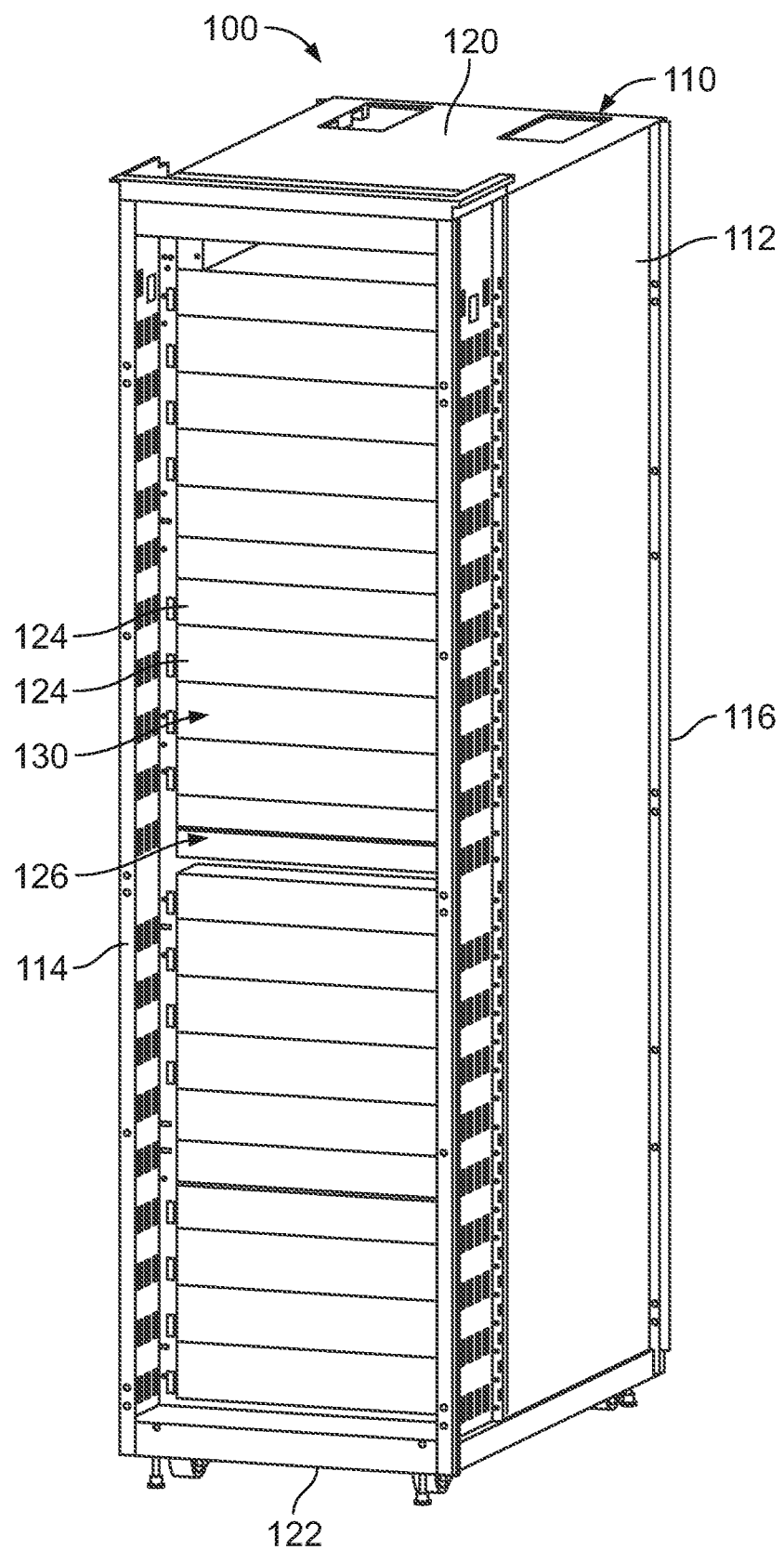
FIG. 1 is a front perspective view of a communication system in accordance with an exemplary embodiment.
Figure 2:
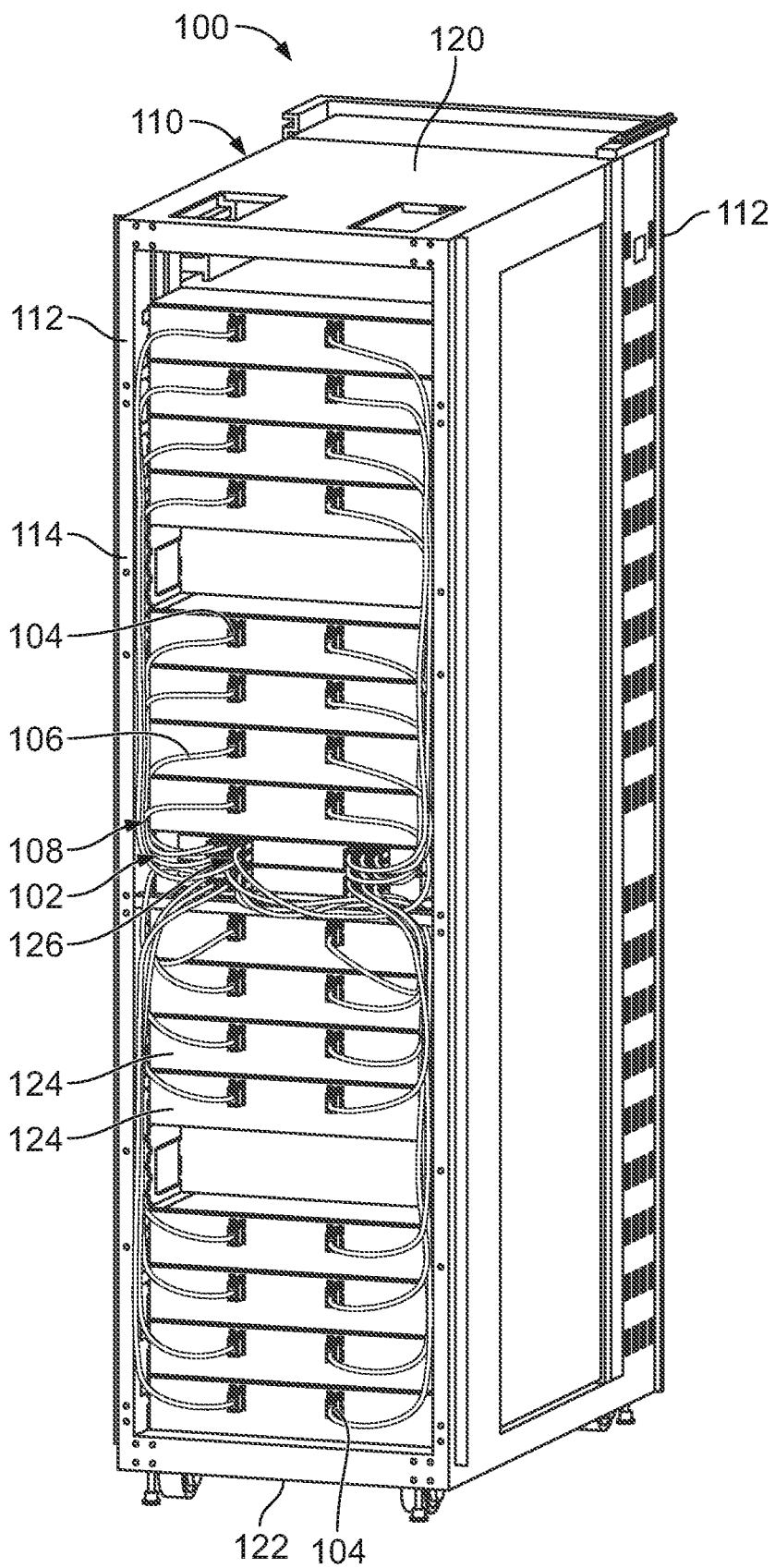
FIG. 2 is a rear perspective view of the communication system in accordance with an exemplary embodiment.
Figure 3:
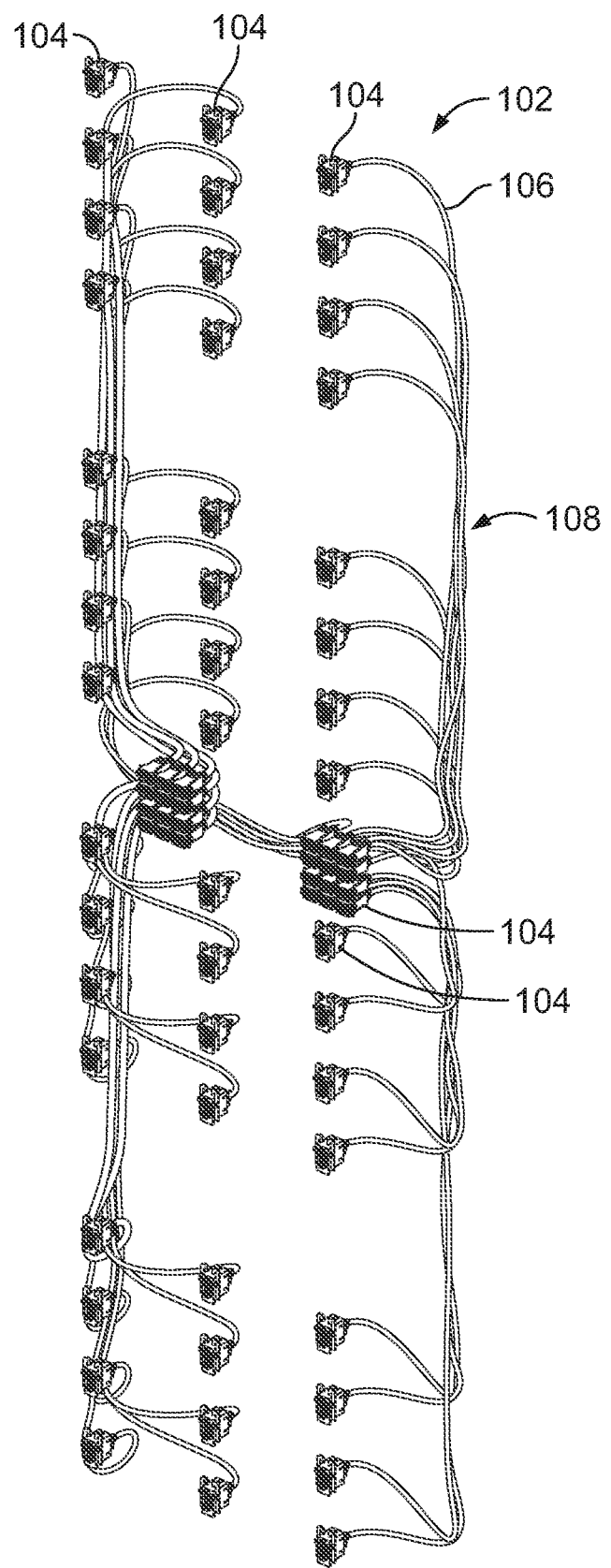
FIG. 3 is a perspective view of a cable assembly of the communication system in accordance with an exemplary embodiment having a panel mount connector assembly in accordance with an exemplary embodiment.

FIG. 1 is a front perspective view of a communication system 100 in accordance with an exemplary embodiment. FIG. 2 is a rear perspective view of the communication system 100 in accordance with an exemplary embodiment. FIG. 3 is a perspective view of a cable assembly 102 of the communication system 100 in accordance with an exemplary embodiment having a plurality of panel mount connector assemblies 104 formed in accordance with an exemplary embodiment. The panel mount connector assemblies 104 are connected by corresponding cables 106 of the cable bundles 108 of the cable assembly 102. In various embodiments, the communication system 100 may be part of or include a data center component, switch, router, server, hub, network, or storage system.

The communication system 100 includes a rack 110 defined by a frame 112 extending between a front 114 and a rear 116. In various embodiments, the rack 110 may include a cabinet enclosing the frame 112. Alternatively, the frame 112 may be open. In an exemplary embodiment, the cable assembly 102 is arranged at the rear 116. The cables 106 are routed along the rear 116. The cables 106 may be secured to the frame 112 for cable management, such as using cable ties. The panel mount connector assemblies 104 are arranged at the rear 116 and may be accessed at the rear 116 for assembly, repair or replacement.

The rack 110 extends between a top 120 and a bottom 122. In an exemplary embodiment, the communication system 100 includes a plurality of shelves 124 arranged within the rack 110. Each shelf 124 may be coupled to the frame 112. Optionally, the shelves 124 may be fixed to the frame 112, such as using fasteners. In other various embodiments, the shelf 124 may be configured to be opened, such as a drawer to access the components of the communication system 100. In the illustrated embodiment, the shelves 124 are stacked within the rack 110. In an exemplary embodiment, the panel mount connector assemblies 104 are mounted to corresponding shelves 124. Optionally, a plurality of panel mount connector assemblies 104 may be coupled to each shelf 124.

In an exemplary embodiment, the communication system 100 may include one or more switches 126 to provide electrical switching within the communication system 100. Various panel mount connector assemblies 104 are electrically connected to the switch 126. The cables 106 are routed from the switch 126 other panel mount connector assemblies 104 at various other shelves 124 within the communication system 100. In the illustrated embodiment, the switch 126 is approximately centered between the top 120 and the bottom 122 within the rack 110. As such, the lengths of the cables 106 may be minimized compared to systems having the switch 126 arranged at the top 120 or at the bottom 122. In other various embodiments, the switch 126 may be provided at other locations. Optionally, multiple switches 126 may be provided. In various embodiments, various cables 106 may be connected to shelves 124 on a different rack 110.

In an exemplary embodiment, the communication system 100 includes one or more electrical components, such as servers 130, arranged within the communication system 100. In various embodiments, the servers 130 may be pluggable into and removable from the communication system 100. For example, the servers 130 may be pluggable into corresponding shelves 124. The servers 130 are configured to be electrically connected to corresponding panel mount connector assemblies 104. Optionally, each shelf 124 may receive multiple servers 130. In the illustrated embodiment, each shelf 124 receives three servers 130. In other various embodiments, each shelf 124 may receive a single server 130. The servers 130 may be electrically connected to the switch 126 by the cables 106.

Figure 4:
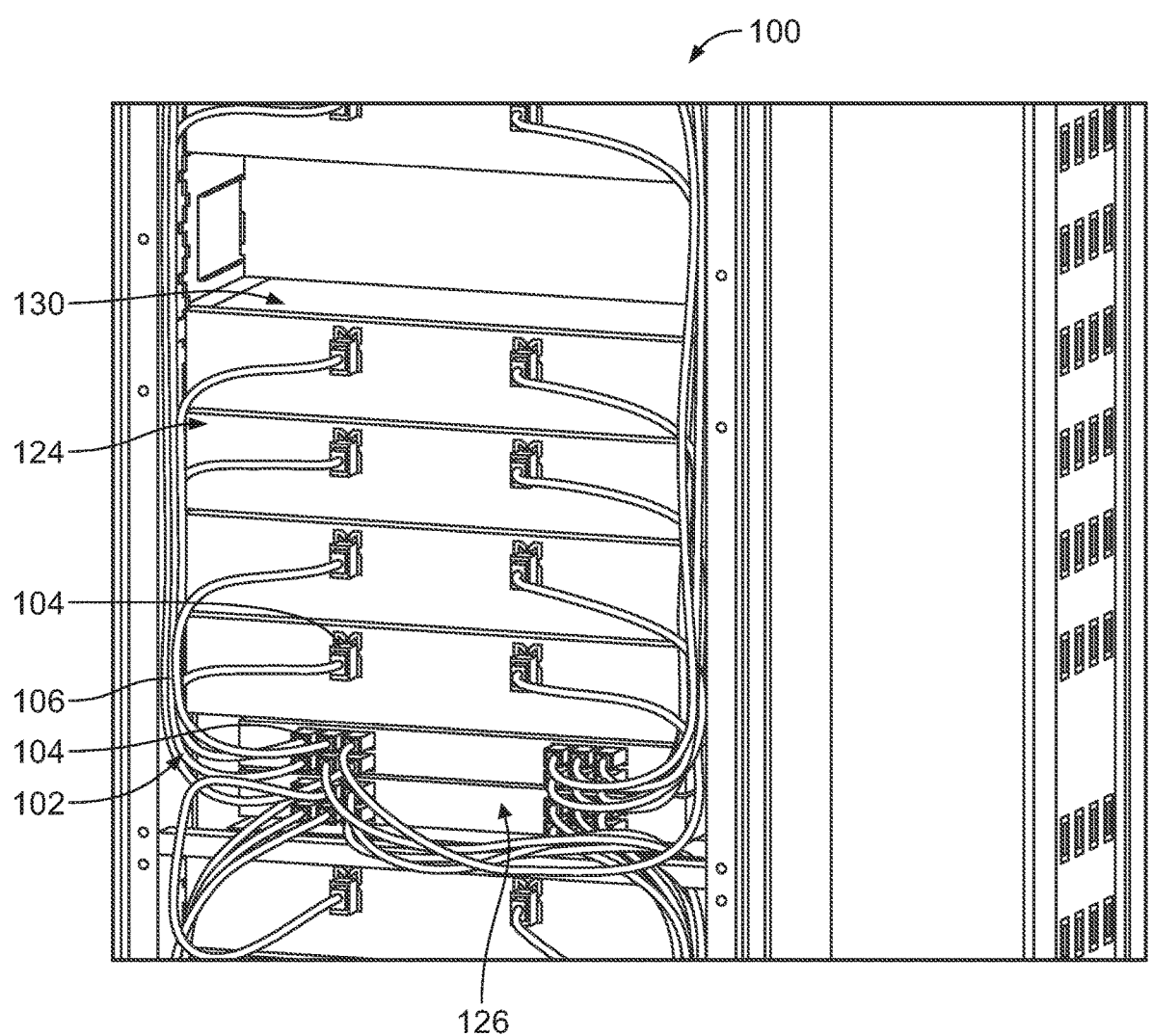
FIG. 4 is a rear perspective view of a portion of the communication system showing panel mount connector assemblies in accordance with an exemplary embodiment.

FIG. 4 is a rear perspective view of a portion of the communication system 100 showing the panel mount connector assemblies 104 in accordance with an exemplary embodiment. The panel mount connector assemblies 104 are mounted to panels of the corresponding shelves 124 and are configured to interface with the servers 130 when the servers 130 are loaded into the shelves 124. Thus, the cable assembly 102 electrically connects the servers 130 within the communication system 100. The cables 106 may be routed between various shelves 124 and/or the switch 126 to electrically connect the servers 130.

The panel mount connector assemblies 104 provide the interfaces with the servers 130. The panel mount connector assemblies 104 are removably coupled to the corresponding panels. In an exemplary embodiment, the panel mount connector assemblies 104 provide a robust interface for interfacing with the servers 130. The panel mount connector assemblies 104 provide a range of mating depths for mating with the servers 130. The panel mount connector assemblies 104 accommodate overdrive of the mating connectors when the servers 130 are loaded into the shelves 124 beyond being fully mated to avoid damage to the panel mount connector assemblies 104. For example, the panel mount connector assemblies 104 are able to float in the mating direction to accommodate the overdrive condition. As such, the rack system may have a large mating tolerances and the connectors may have a smaller mating tolerances (for example, rack has a larger mating range than the mating range of the connectors).

Figure 5:
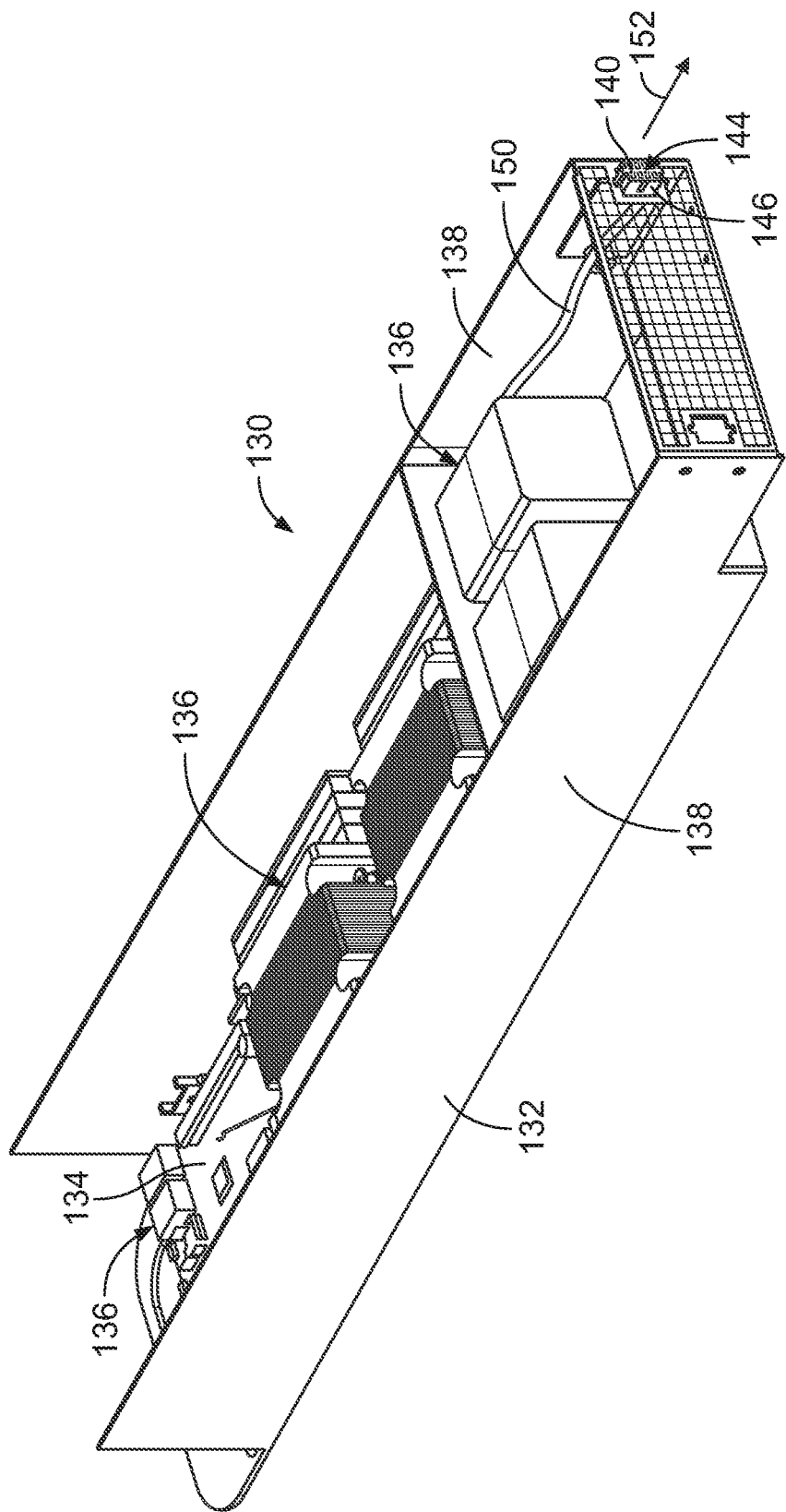
FIG. 5 is a rear perspective view of an electrical component of the communication system in accordance with an exemplary embodiment.

FIG. 5 is a rear perspective view of the server 130 in accordance with an exemplary embodiment. The server 130 includes a tray 132 holding a server host board 134 having electrical components 136 mounted on the server host board 134. For example, the server host board 134 may have various electrical connectors, processors, memory modules, optical devices, heat sinks, fans, power connectors and the like mounted thereto. The tray 132 is configured to be loaded into the shelf 124 (FIG. 4) and removable from the shelf 124. In the illustrated embodiment, the tray 132 include sidewalls 138; however, in alternative embodiments, the tray 132 may only include a base to support the server host board 134 and/or other components.

The server 130 includes a mating connector 140. In the illustrated embodiment, the mating connector 140 is provided at a rear of the server 130. The mating connector 140 has a mating interface 144 configured to be mated with the panel mount connector assembly 104. For example, the mating connector 140 may be plugged into the panel mount connector assembly 104. In an exemplary embodiment, the mating connector 140 includes a mating connector housing 146 holding a plurality of contacts (not shown). In various embodiments, the contacts are electrical contacts. In alternative embodiments, the contacts may be fiber optic contacts, such as a fiber optic ferrule. In the illustrated embodiment, the mating connector 140 is separate from the server host board 134 and is electrically connected thereto by a cable 150. In alternative embodiments, the mating connector 140 may be mounted directly to the server host board 134. Optionally, the server 130 may have multiple mating connectors 140. The mating connector 140 is configured to be mated with the panel mount connector assembly 104 in a mating direction 152.

Figure 6:
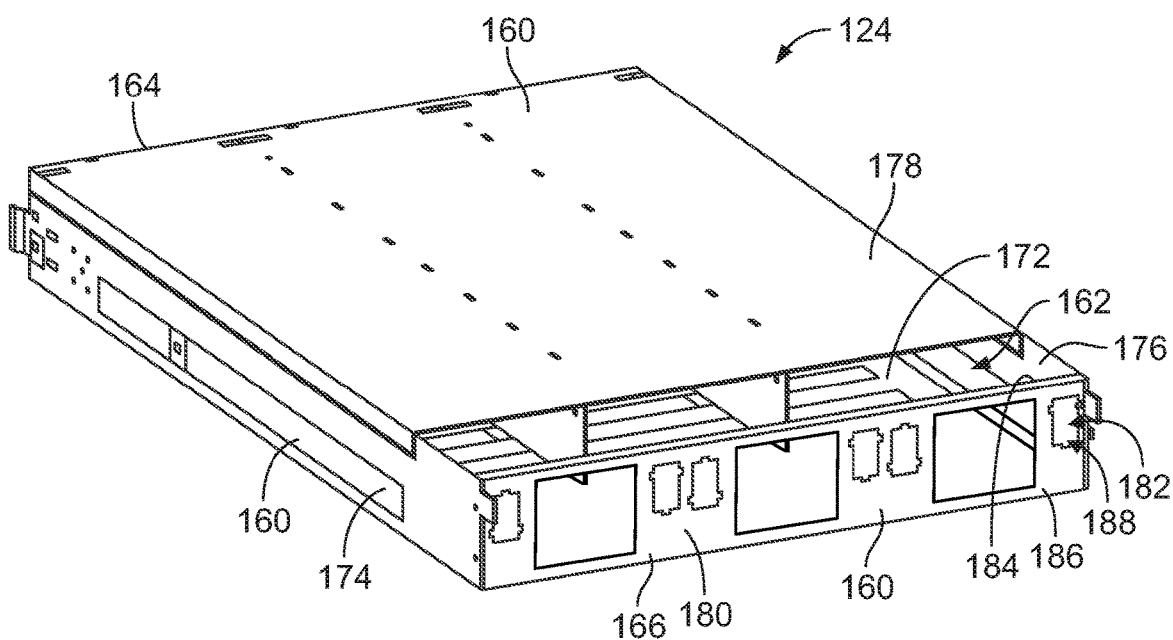
FIG. 6 is a rear perspective view of a component of the communication system in accordance with an exemplary embodiment.
Figure 7:
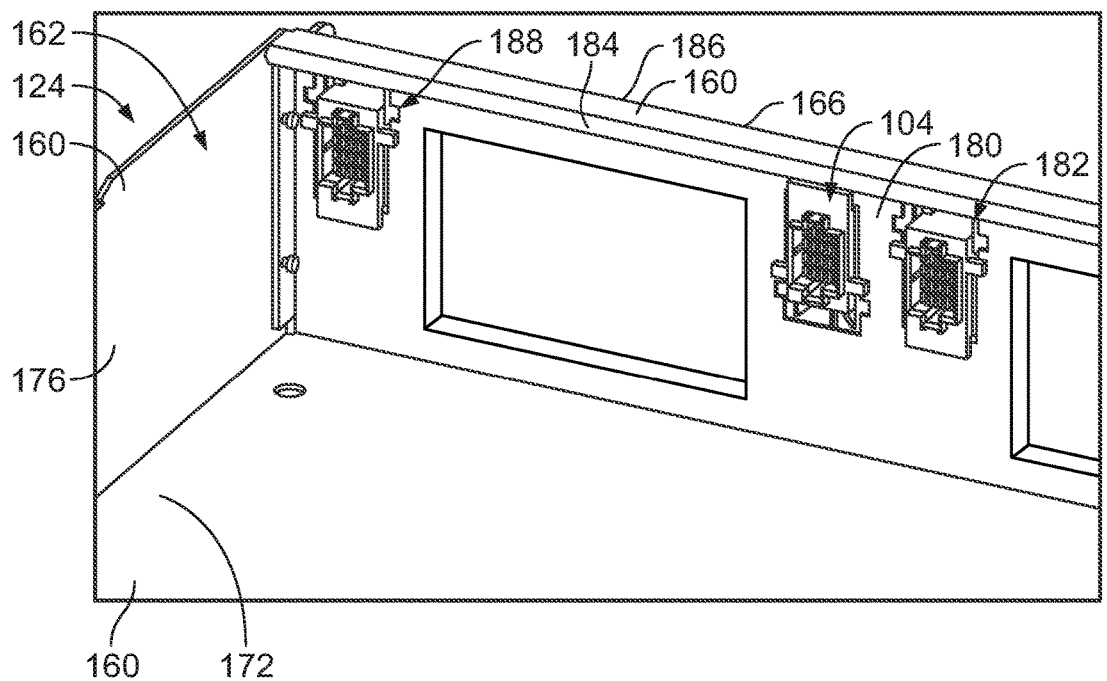
FIG. 7 is a perspective view of a portion of the communication system in accordance with an exemplary embodiment showing panel mount connector assemblies.

FIG. 6 is a rear perspective view of the shelf 124 in accordance with an exemplary embodiment. FIG. 7 is a perspective view of a portion of the shelf 124 in accordance with an exemplary embodiment showing panel mount connector assemblies 104 coupled to the shelf 124.

The shelf 124 includes a plurality of panels 160 forming a space 162 that receives the servers 130 (shown in FIG. 5). The shelf 124 extends between a front 164 and a rear 166. In the illustrated embodiment, the panels 160 include a top panel 178 base panel 172, side panels 174, 176 and internal panels 178 that divide the space 162 into compartments that receive corresponding servers 130. In an exemplary embodiment, the shelf 124 includes a rear panel 180 at the rear 166. The rear panel 180 includes a first side 184 defining an interior side and a second side 186 defining an exterior side of the rear panel 180. The rear panel 180 includes one or more panel cutouts 182 configured to receive corresponding panel mount connector assemblies 104 (FIG. 7). In an exemplary embodiment, the rear panel 180 includes notches 188 around the panel cutout 182 configured to receive portions of the panel mount connector assembly 104.

In an exemplary embodiment, the panel mount connector assemblies 104 are slide-lock panel mount connector assemblies 104 configured to be loaded into the panel cutouts 182 and slid to a locked position in which the panel mount connector assemblies 104 are locked to the rear panel 180. Such panel mount connector assemblies 104 may be assembled without the use of tools or additional fasteners. However, in other alternative embodiments, the panel mount connector assemblies 104 may be coupled to the rear panel 180 by other means or processes, such as using clips, fasteners and the like. In an exemplary embodiment, the panel mount connector assemblies 104 configured to be mated with the mating connectors 140 of the servers 130 (shown in FIG. 5) in a mating direction generally perpendicular to the rear panel 180. In an exemplary embodiment, the panel mount connector assemblies 104 are able to float in the mating direction during mating to accommodate overdrive of the mating connector 140 by the server 130 into the shelf 124. For example, the mating interface of the panel mount connector assembly 104 may be compressible and the mating direction to accommodate over-travel of the mating connector 140 after the mating connector 140 is fully mated with the panel mount connector assembly 104.

Figure 8:
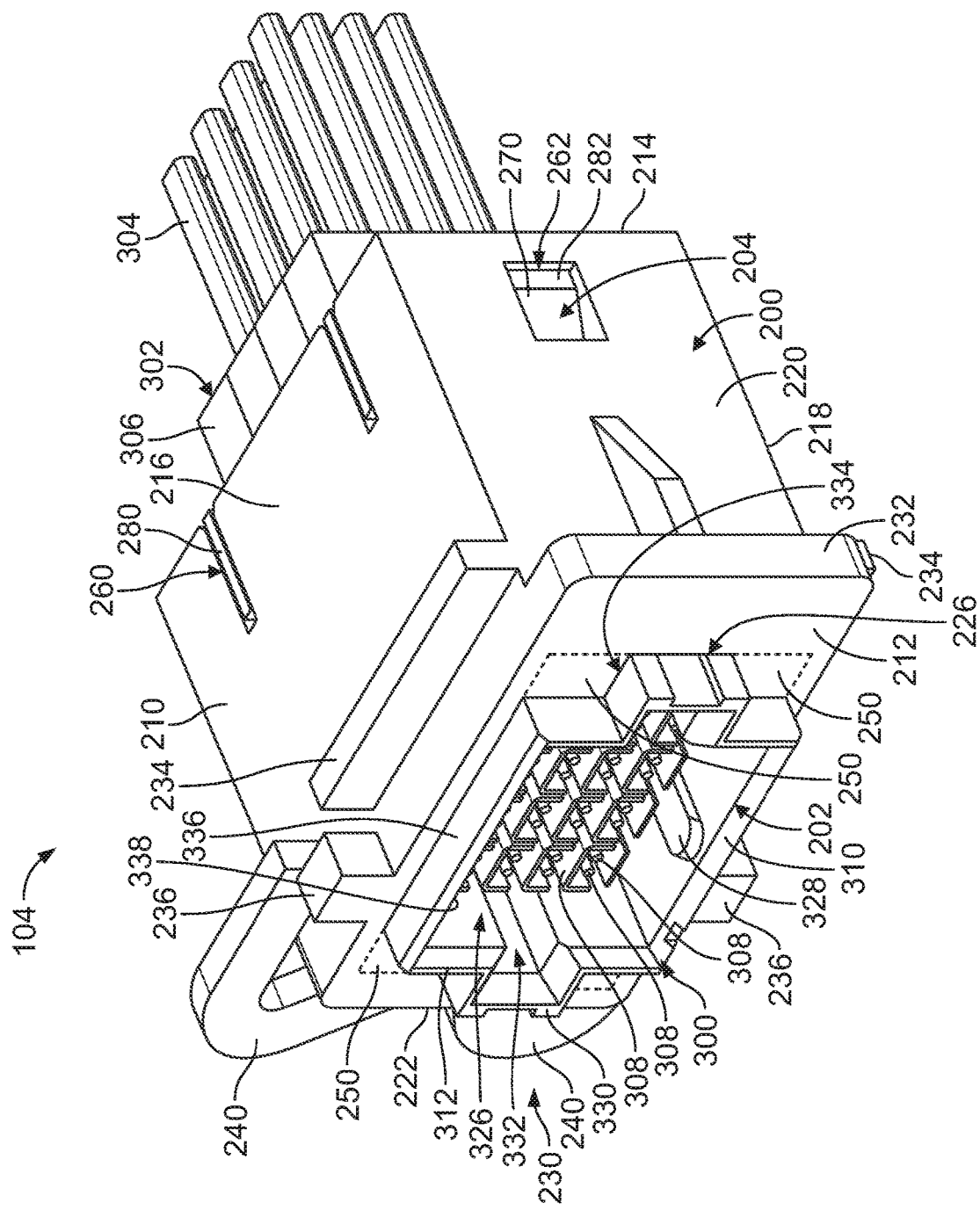
FIG. 8 is a front perspective view of the panel mount connector assembly in accordance with an exemplary embodiment.
Figure 9:
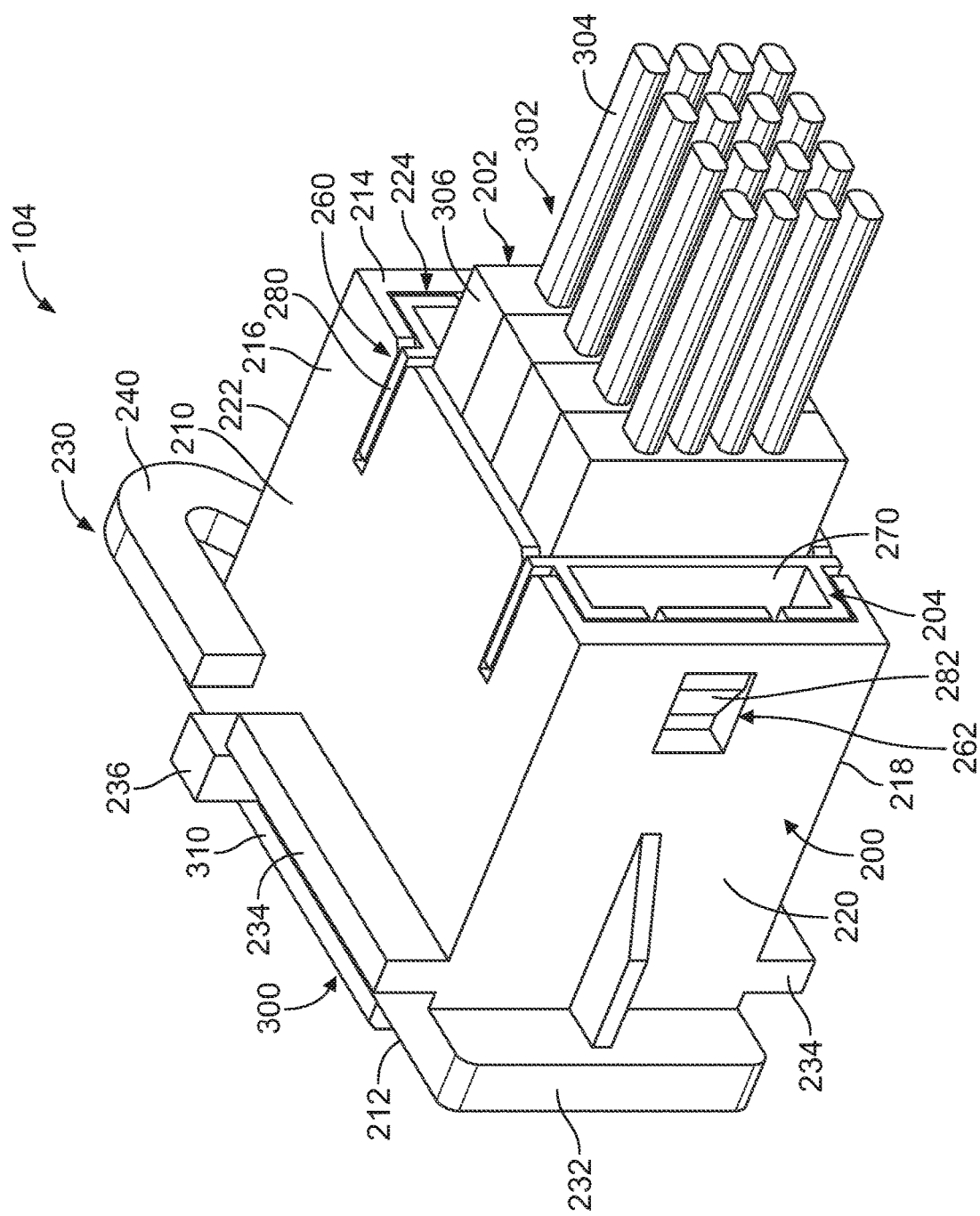
FIG. 9 is a rear perspective view of the panel mount connector assembly in accordance with an exemplary embodiment.
Figure 10:
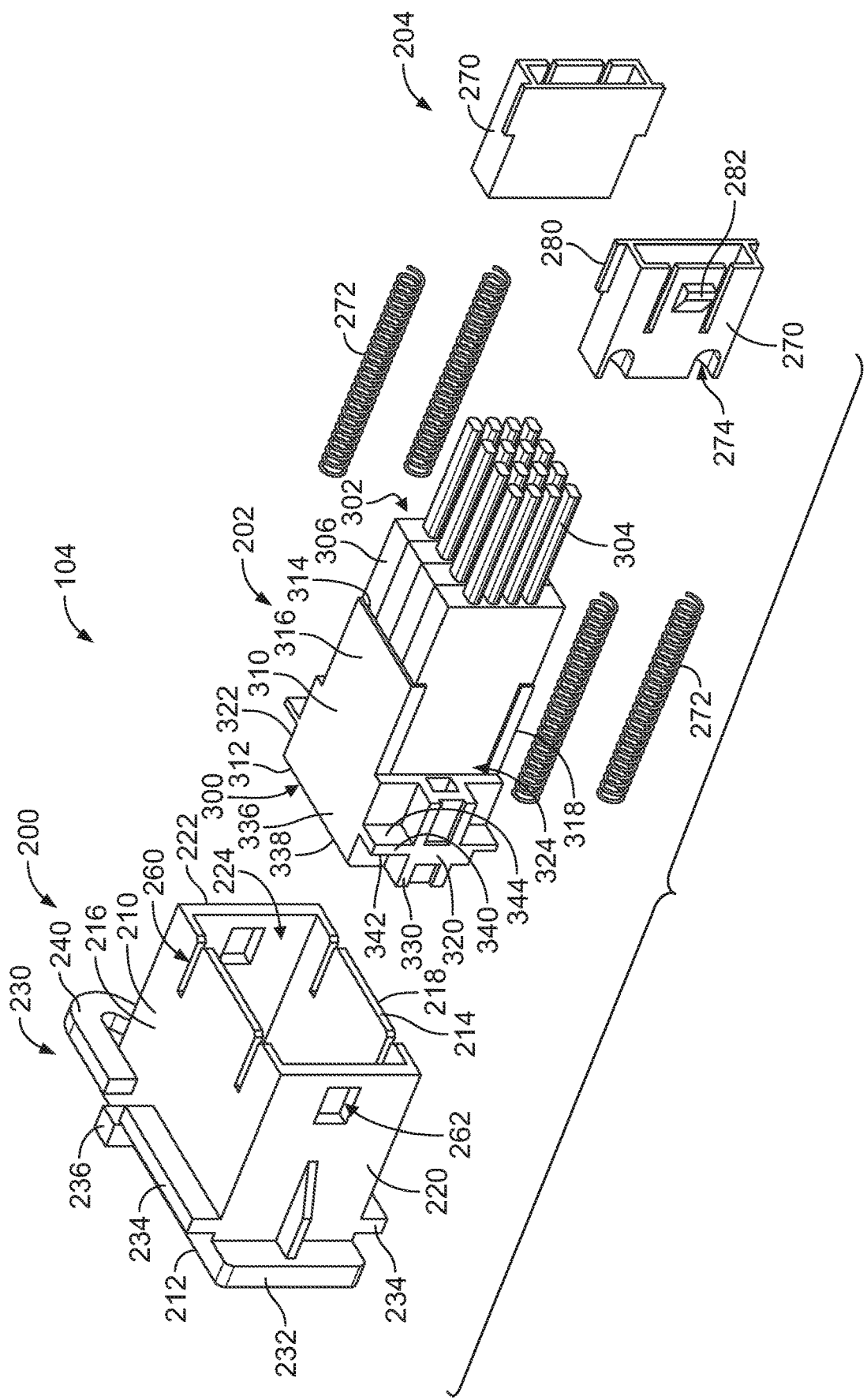
FIG. 10 is an exploded view of the panel mount connector assembly in accordance with an exemplary embodiment.

FIG. 8 is a front perspective view of the panel mount connector assembly 104 in accordance with an exemplary embodiment. FIG. 9 is a rear perspective view of the panel mount connector assembly 104 in accordance with an exemplary embodiment. FIG. 10 is an exploded view of the panel mount connector assembly 104 in accordance with an exemplary embodiment.

The panel mount connector assembly 104 includes a panel mount bracket 200 configured to be mounted to the panel 180, a connector 202 received in the panel mount bracket 200 and a biasing mechanism 204 received in the panel mount bracket engaging the connector 202 and forward biasing the connector 202 in the panel mount bracket 200. The connector 202 is movable within the panel mount bracket 200 to accommodate overtravel of the mating connector 140 (shown in FIG. 5) during an overdrive condition caused by loading the server 130 into the shelf 124 (both shown in FIG. 1). In an exemplary embodiment, the biasing mechanism 204 has a biasing force exceeding a mating force with the mating connector 140 such that the connector 202 remains forward biased in the panel mount bracket 200 during mating with the mating connector 140. However, the biasing mechanism 204 allows the connector 202 to move rearward when the biasing force is exceeded, such as during the overdrive condition. As such, during normal mating conditions, when the mating connector 140 is initially mated with the connector 202, the connector 202 remains forward biased in the panel mount bracket 200.

The mating connector 140 is configured to be fully mated with the connector 202 before the connector 202 starts to reseed. The biasing mechanism 204 provides enough force to hold the connector 202 preloaded in the forward position for normal mating with the mating connector. However, when the server 130 is over loaded into the shelf 124, the biasing mechanism 204 allows the connector 202 to move rearward to prevent damage to the connector 202 and/or the mating connector 140 and/or allows the server 130 to fully load into the shelf 124. The loading tolerance of the server 130 into the shelf 124 may be greater than the mating tolerance of the mating connector 140 with the connector 202 and the biasing mechanism 204 accommodates the larger loading tolerance of the server 130, thus allowing the mating connector 140 and the connector 202 to be designed to have a tighter mating range.

The panel mount bracket 200 includes a body 210 extending between a front 212 and a rear 214. In an exemplary embodiment, the body is manufactured from a dielectric material, such as a plastic material. The panel mount bracket 200 includes a first side 216 and a second side 218. The panel mount bracket 200 includes a first end 220 and a second end 222. The body 210 defines a cavity 224 extending between the front 212 and the rear 214. The cavity 224 is open at the rear 214 to receive the connector 202 and the biasing mechanism 204. In an exemplary embodiment, the panel mount bracket 200 includes a front opening 226 at the front 212 open to the cavity 224. The connector 202 and the biasing mechanism 204 are configured to be rear loaded into the cavity 224. In an exemplary embodiment, the connector 202 protrudes from the cavity 224 through the front opening 226.

In an exemplary embodiment, the panel mount bracket 200 includes a mounting feature 230 for mounting the panel mount bracket 200 to the panel 180. In the illustrated embodiment, the mounting feature 230 is a slide lock panel mount feature. For example, the mounting feature 230 may be loaded through the cutout 182 and the panel 180 and then slid to a locked position.

In the illustrated embodiment, the mounting feature 230 includes a first flange 232 and a second flange 234 laterally offset from the first flange 232. For example, the first flange 232 is provided at the front 212 and the second flange 234 is stepped back from the front 212 a distance to accommodate the panel 180 between the first flange 232 and the second flange 234. Optionally, the first flange 232 is provided at the first end 220 and the second flange 234 is provided at the first side 216; however, the flanges 232, 234 may be provided at additional or alternative locations in other various embodiments. For example, in the illustrated embodiment, the panel mount bracket 200 includes flanges 234 at the first and second sides 216, 218. In the illustrated embodiment, the mounting feature 230 includes mounting tabs 236 extending from the body 210 at the front 212. The mounting tabs 236 are configured to be received in corresponding notches 188 when the panel mount bracket 200 is loaded into the cutout 182 and the panel 180. The mounting tabs 236 may be coplanar with the first flange 232 and laterally offset forward of the second flange 234.

In an exemplary embodiment, the panel mount bracket 200 includes one or more flexible mounting arms 240. In the illustrated embodiment, the flexible mounting arms 240 are provided at the second end 222. For example, the flexible mounting arms 240 may be coupled to the first and second sides 216, 218 and are cantilevered therefrom to the second end 222. The flexible mounting arms 240 are configured to elastically engage the panel 180 to hold the panel mount bracket 200 against the panel 180. For example, after the panel mount bracket 200 is slid to the locked position, the flexible mounting arms 240 may hold the panel mount bracket 200 in the locked position. In an exemplary embodiment, the flexible mounting arms 240 include locks 242 at distal ends of the flexible mounting arms 240. The locks 242 engage the panel 180 in the locked position other types of mounting features 230 and/or locking features may be provided in alternative embodiments to secure the panel mount bracket 200 to the panel 180.

In an exemplary embodiment, the panel mount bracket 200 includes shoulders 250 at the front 212. The shoulders 250 are forward of the cavity 224. The shoulders 250 close off portions of the cavity 224. The shoulders 250 are adjacent the front opening 226 and the fine edges of the front opening 226. The shoulders 250 are configured to engage the connector 202. In an exemplary embodiment, the connector 202 is pushed forward in the cavity 224 until the connector 202 engages the shoulders 250. The shoulders 250 stop forward biasing of the connector 202 by the biasing mechanisms 204. For example, the connector 202 is biased against the shoulders 250 by the biasing mechanisms 204.

In an exemplary embodiment, the panel mount bracket 200 includes locating features 260 for locating the biasing mechanisms 204 and/or the connector 202 in the cavity 224. In the illustrated embodiment, the locating features 260 are defined by slots formed in the first side 216 and the second side 218 at the rear 214. Other types of locating features 260 may be provided in alternative embodiments.

In an exemplary embodiment, the panel mount bracket 200 includes latching features 262 used for securing the biasing mechanisms 204 in the cavity 224. In the illustrated embodiment, the latching features 262 are defined by openings in the first and second ends 220, 222. Other types of latching features 262 may be provided in alternative embodiments.

In the illustrated embodiment, the panel mount connector assembly 104 includes a pair of biasing mechanisms 204 are arranged on opposite sides of the cavity 224; however, the panel mount connector assembly 104 may include greater or fewer biasing mechanisms 204 in alternative embodiments. In an exemplary embodiment, each biasing mechanism 204 includes a retainer clip 270 and one or more springs 272 configured to be spring loaded between the retainer clip 270 and the connector 202. In the illustrated embodiment, the springs 272 are coil springs; however, other types of springs or biasing elements may be used in alternative embodiments. The retainer clip 270 and the springs 272 are configured to be rear loaded into the cavity 224 behind the connector 202. The springs 272 preload the connector 202 in the cavity 224 for mating with the mating connector 140. In an exemplary embodiment, the spring force is larger than the mating force of the mating connector 140 and thus the connector 202 remains in the forward biased position during mating.

In an exemplary embodiment, the retainer clip 270 includes a pocket 274 receiving an end of the spring 272. The retainer clip 270 has a biasing surface within the pocket 274 engaged by the spring 272. In an exemplary embodiment, the retainer clip 270 is configured to be fixed within the cavity 224. The retainer clip 270 includes locating features 280 that engages the locating features 260 of the panel mount bracket 200 to locate the biasing mechanism 204 in the cavity 224. In the illustrated embodiment, the locating features 280 are defined by tabs that are configured to be received in the slots in the panel mount bracket 200. The retainer clip 270 includes a latching feature 282 configured to engage the latching feature 262 to secure the retainer clip 270 to the panel mount bracket 200. In the illustrated embodiment, the latching feature 282 is a deflectable latch. Other types of latching features may be used in alternative embodiments.

The connector 202 extends between a mating end 300 and a cable end 302. Cables 304 extend from the cable end 302. In the illustrated embodiment, the cables 304 are twin-axial cables each having a differential pair of signal conductors therein. In an exemplary embodiment, the cables 304 are electrically shielded. In alternative embodiments, other types of cables may be used, such as coaxial cables. In other various embodiments, the cables 304 may be fiber optic cables.

The connector 202 includes a connector housing 310 holding one or more contact assemblies 306. The contact assemblies 306 have contacts 308 at the mating end 300. The cables 304 are terminated to the contacts 308. In an exemplary embodiment, the contacts 308 include signal contacts and ground contacts. The signal contacts may be arranged in pairs as differential pairs surrounded by corresponding ground contacts. For example, the ground contacts may be C-shields at the mating end 300 providing electrical shielding on multiple sides of the pairs of signal contacts. Other arrangements of the signal and ground contacts may be provided in alternative embodiments. In other various embodiments, the contacts 308 may be fiber optic contacts.

In the illustrated embodiment, the contact assemblies 306 are stacked wafers. The cables 304 extend from the contact assemblies 306. Optionally, the contact assemblies 306 may be overmolded bodies over the contacts 308 and/or the cables 304. The contact assemblies 306 are rear loaded into the connector housing 310.

The connector housing 310 extends between a front 312 and a rear 314. The connector housing 310 includes a first side 316 and a second side 318. The connector housing 310 includes a first end 320 and a second end 322. The connector housing 310 has a rear cavity 324 at the rear 314 that receives the contact assemblies 306. The connector housing 310 has a front cavity 326 at the front 312 that receives the mating connector 140. The contacts 308 are arranged in the front cavity 326 for mating with the mating connector 140. In an exemplary embodiment, the connector housing 310 may include one or more guide features 328 and the front cavity 326 to guide mating with the mating connector 140. For example, in the illustrated embodiment, the guide features 328 are guide ribs.

The connector housing 310 includes extensions 330 at the first end 320 and the second end 322. The extensions 330 form channels 332 and the front cavity 326 configured to receive guideposts of the mating connector 140 to guide mating with the mating connector 140. The extensions 330 are received in cutouts 334 in the front opening 226 of the panel mount bracket 200 defined between corresponding shoulders 250. The shoulders 250 may engage the extensions 330 to locate the connector 202 within the front opening 226.

The connector housing 310 includes a lip 336 at the mating end 300. The lip 336 extends to a front edge 338. The front edge 338 may define the front 312 of the connector housing 310. The lip 336 passes through the front opening 226 such that the front edge 336 is forward of the front 212 of the panel mount bracket 200. The connector 202 is movable within the cavity 224, such as when the biasing mechanism 204 is compressed. As the biasing mechanism 204 is compressed, the lip 336 moves rearward. The front edge 338 moves closer to the front 212 of the panel mount bracket 200 when the connector 202 moves rearward. In an exemplary embodiment, the front edge 338 remains forward of the front 212 of the panel mount bracket 200 even when fully compressed such that the connector housing 310 remains in the front opening 226. The retainer clip 270 may block rearward movement of the connector 200 beyond a limit. For example, the extensions 330 may bottom out (for example, rest on) against the front of the retainer clips 270.

In an exemplary embodiment, the connector housing 310 includes end walls 340 at the first end 320 and the second end 322. The end walls 340 extend from the extensions 330 toward the first side 316 and the second side 318. In the illustrated embodiment, the end walls 340 are recessed rearward of the front 312. As such, a portion of the connector housing 310 extends forward of the end walls 340. The end walls 340 include front surfaces 342 and rear surfaces 344. The end walls 340 may be used for positioning the connector 202 within the panel mount bracket 200. For example, the biasing mechanisms 204 may be biased against the end walls 340, such as against the rear surfaces 344. The end walls 340 may press against the panel mount bracket 200 to locate the connector 202 within the cavity 224. For example when the connector housing 310 is loaded into the cavity 224 of the panel mount bracket 200, the front surfaces 342 of the end walls 340 face the interior surfaces of the shoulders 250. The connector 202 may be spring biased forward until the end walls 340 engage the shoulders 250. The end walls 340 bottom out against the shoulders 250 in the forward biased position. In alternative embodiments, different walls may be provided for engaging the panel mount bracket 200 and the biasing mechanisms 204 rather than using the end walls 340 for engaging both the panel mount bracket 200 and the biasing mechanisms 204.

Figure 11:
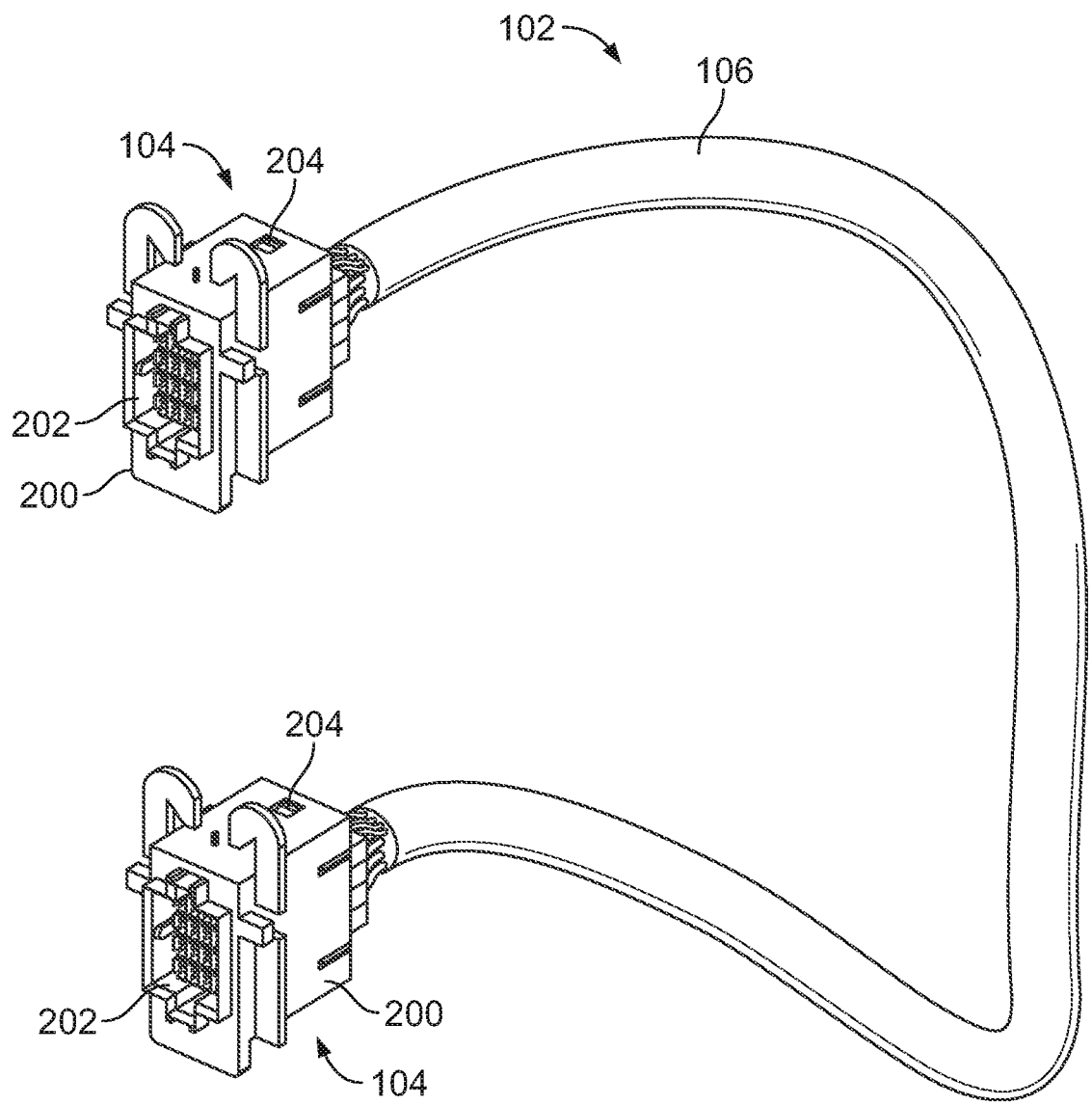
FIG. 11 is a perspective view of the cable assembly in accordance with an exemplary embodiment.

FIG. 11 is a perspective view of the cable assembly 102 in accordance with an exemplary embodiment showing the cable 106 extending between first and second panel mount connector assemblies 104. In the illustrated embodiment, the first and second panel mount connector assemblies 104 are identical both including panel mount brackets 200, connectors 202 and biasing mechanisms 204. Each of the cables 106 within the cable bundle 108 extend between the first and second panel mount connector assemblies 104.

Figure 12:
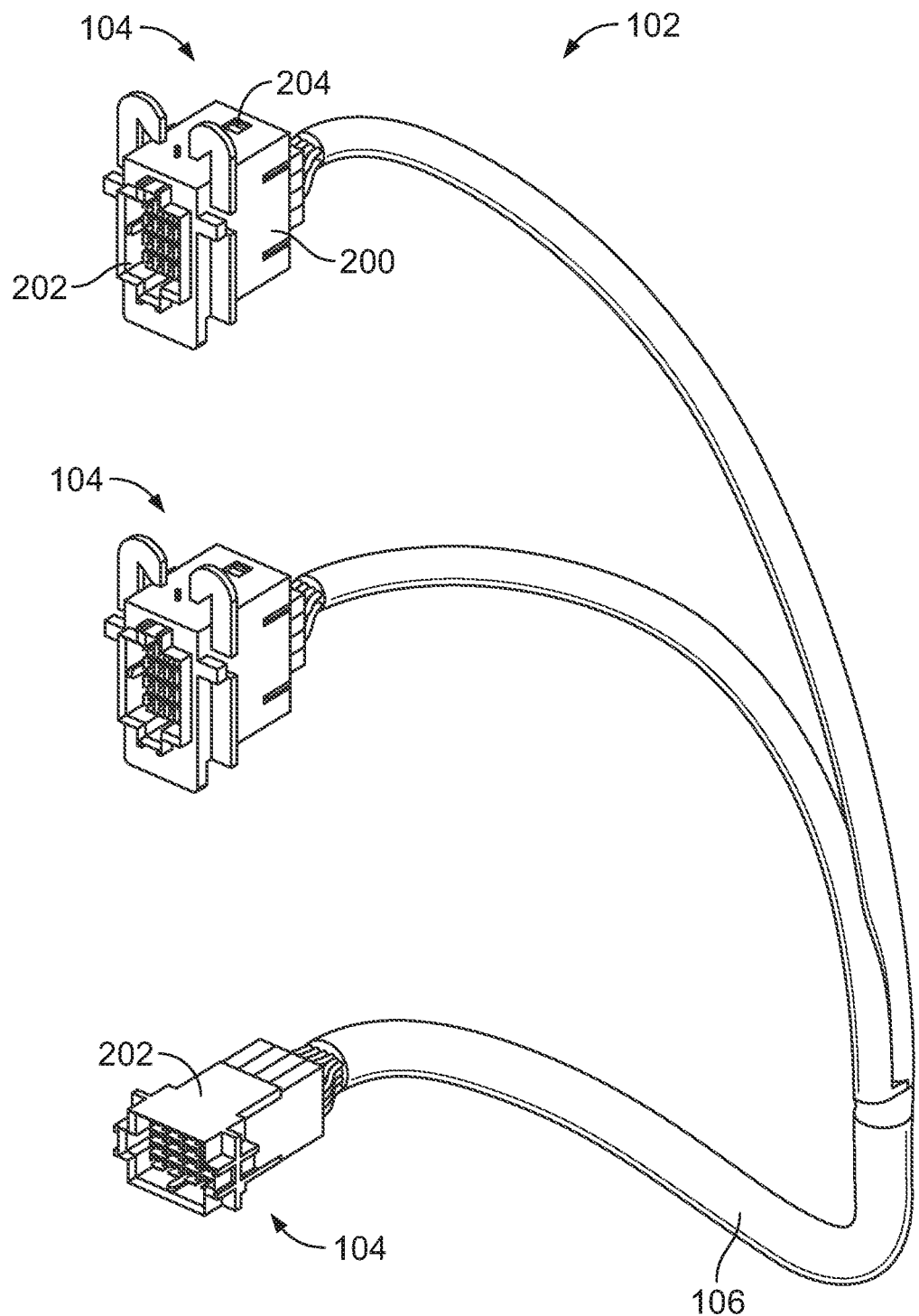
FIG. 12 is a perspective view of the cable assembly in accordance with an exemplary embodiment.

FIG. 12 is a perspective view of the cable assembly 102 in accordance with an exemplary embodiment showing the cable 106 extending between first, second and third panel mount connector assemblies 104. In the illustrated embodiment, the first and second panel mount connector assemblies 104 are identical both including panel mount brackets 200, connectors 202 and biasing mechanisms 204; however, the third panel mount connector assembly 104 includes the connector 202 but does not include any panel mount bracket or biasing mechanism. The third panel mount connector assembly 104 is electrically connected to both of the first and second panel mount connector assemblies 104. For example, cables are routed from the first panel mount connector assembly 104 to the third panel mount connector assembly 104 and cables are routed from the second panel mount connector assembly 104 to the third panel mount connector assembly 104. In various embodiments, the third panel mount connector assembly 104 may be electrically connected to the switch 126 (shown in FIG. 2) and the first and second panel mount connector assemblies 104 may be electrically connected to corresponding shelves 124 for electrical connection to corresponding servers 130 (shown in FIG. 2).

Figure 13:
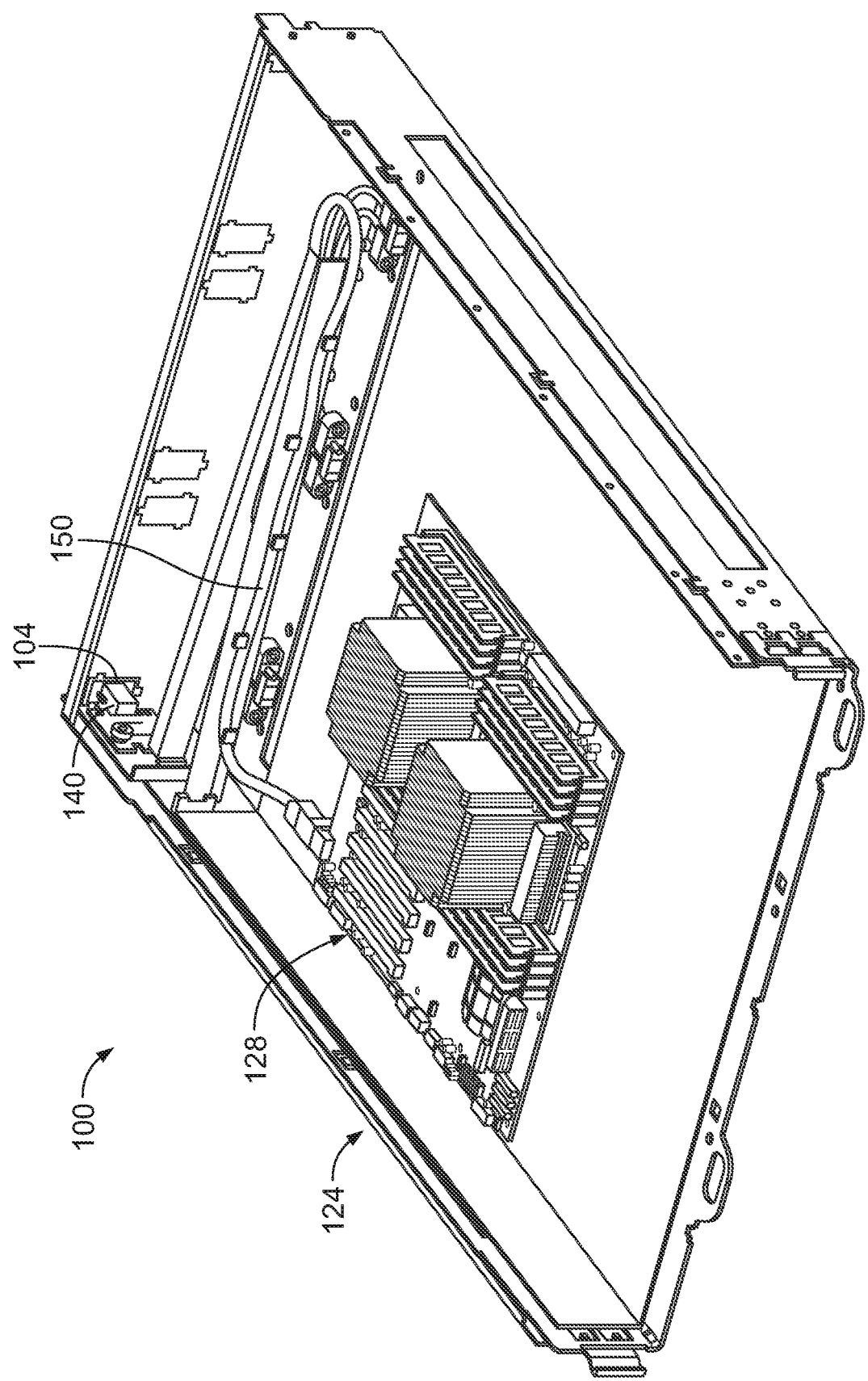
FIG. 13 is a perspective view of a portion of the communication system in accordance with an exemplary embodiment.
Figure 14:
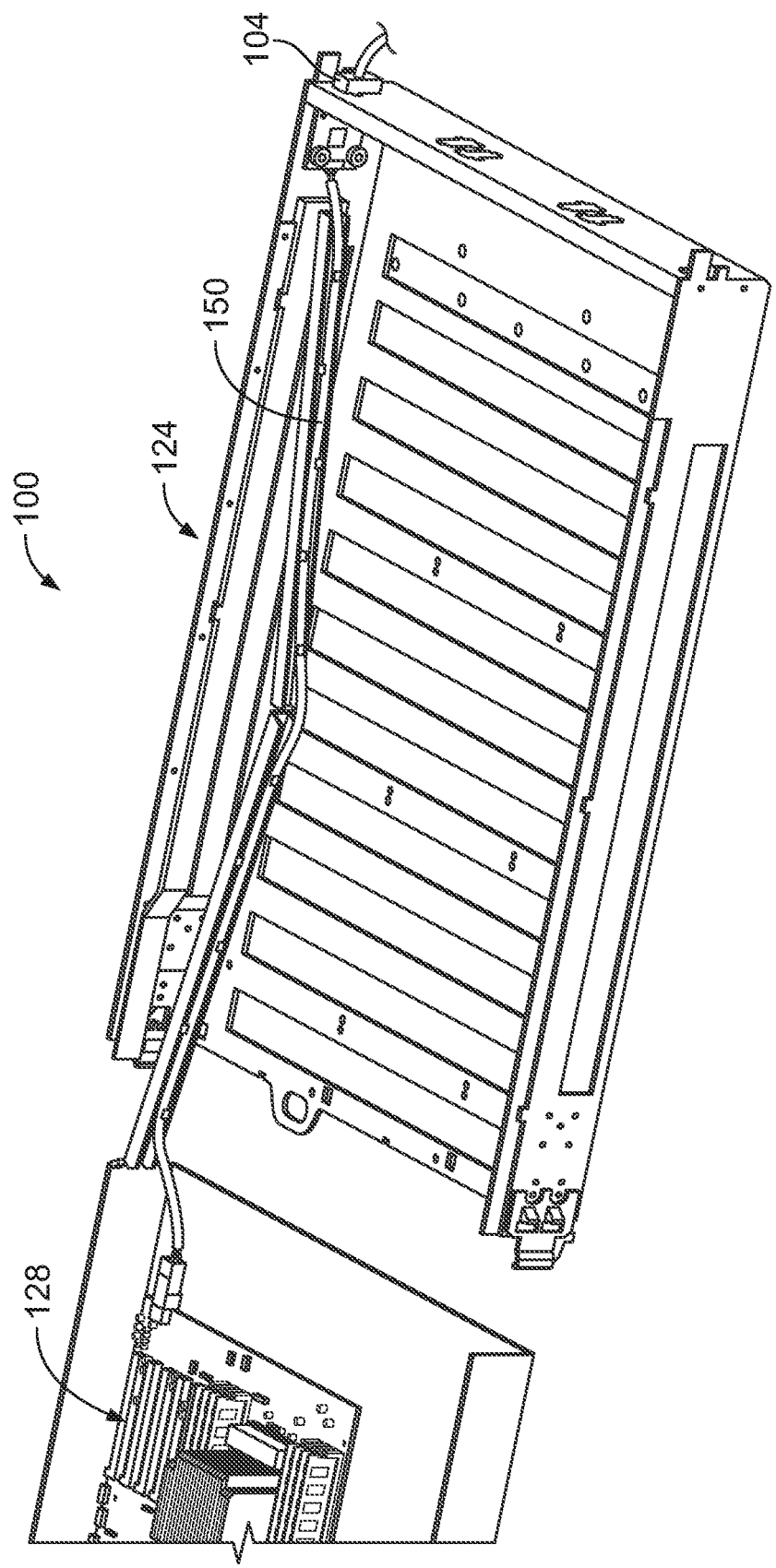
FIG. 14 is a perspective view of a portion of the communication system.

FIG. 13 is a perspective view of a portion of the communication system 100 in accordance with an exemplary embodiment showing one shelf 124 in the form of an extendable drawer having an electrical component 128 mounted therein. FIG. 14 is a perspective view of a portion of the communication system 100 in accordance with an exemplary embodiment showing one shelf 124 in the form of an extendable drawer having the drawer extended. The electrical component 128 may be a server or another electrical component. The electrical component 128 includes the mating connector 140 connected by the cable 150. The cable 150 is extendable with the drawer. The panel mount connector assembly 104 is coupled to the mating connector 140.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A panel mount connector assembly comprising:
a panel mount bracket extending between a front and a rear, the panel mount bracket having a cavity open at the rear, the panel mount bracket having a front opening at the front open to the cavity, the panel mount bracket having a shoulder adjacent the front opening;
a connector movably received in the cavity, the connector having a mating end and a cable end, the connector having contacts at the mating end and having cables terminated to the contacts extending rearward from the cable end, the contacts configured to be mated with a mating connector plugged into the connector at the mating end, the connector having an end wall in the cavity facing the shoulder; and
a biasing mechanism received in the cavity, the biasing mechanism engaging the connector and forward biasing the connector in the cavity;
wherein the biasing mechanism has a biasing force exceeding a mating force with the mating connector such that the connector remains forward biased in the cavity during mating with the mating connector, the biasing mechanism forward biases the connector until the end wall engages the shoulder to forward position the connector in the cavity; and
wherein the biasing mechanism allows the connector to move rearward when the biasing force is exceeded.

2. The panel mount connector assembly of claim 1, wherein the biasing mechanism compensates for overdrive of the mating connector beyond full mating with the connector allowing the mating end of the connector and the cable end of the connector to move rearward when the mating connector is in overdrive beyond full mating.

3. The panel mount connector assembly of claim 1, wherein the biasing mechanism engages a rear surface of the end wall of the connector and a front surface of the end wall is configured to engage the shoulder when the connector is forward biased.

4. The panel mount connector assembly of claim 1, wherein the connector includes a lip at the mating end of the connector extending to a front edge, the lip passing through the front opening such that the front edge is forward of the front of the panel mount bracket, wherein the front edge moves closer to the front of the panel mount bracket when the connector moves rearward.

5. The panel mount connector assembly of claim 1, wherein the biasing mechanism includes a retainer clip coupled to the panel mount bracket and a spring, the spring being spring loaded between the retainer clip and the connector to forward bias the connector in the cavity.

6. The panel mount connector assembly of claim 1, wherein the biasing mechanism is a first biasing mechanism, the panel mount connector assembly further comprising a second biasing mechanism received in the cavity, the second biasing mechanism engaging the connector and forward biasing the connector in the cavity.

7. The panel mount connector assembly of claim 1, wherein the panel mount bracket has a first flange and a second flange laterally offset to receive a panel between the first flange and the second flange, the panel mount bracket having a flexible mounting arm configured to elastically engage the panel to hold the panel mount bracket against the panel.

8. The panel mount connector assembly of claim 7, wherein the first flange is configured to be received in a cutout in the panel and the panel mount bracket is configured to be slid to a locked position where the first flange is offset from the cutout and engages a first side of the panel, the second flange engages a second side of the panel, and the flexible mounting arm engages the second side.

9. The panel mount connector assembly of claim 1, wherein the connector holds a plurality of contact assemblies, each contact assembly having a contact holder holding a plurality of the contacts and a plurality of the cables, the cables extending rearward from the contact holder.

10. The panel mount connector assembly of claim 1, wherein the contacts are fiber-optic contacts and the cables are fiber optic cables.

11. A cable assembly comprising:
a cable bundle having a plurality of cables;
a first panel mount connector assembly configured to be coupled to a first panel, the first panel mount connector assembly comprising:
a panel mount bracket extending between a front and a rear, the panel mount bracket having a cavity open at the rear, the panel mount bracket having a front opening at the front open to the cavity, the panel mount bracket having a shoulder adjacent the front opening, the panel mount bracket configured to be mounted to the first panel;
a connector movably received in the cavity, the connector having a mating end and a cable end, the connector holding contacts at the mating end and having cables terminated to the contacts extending rearward from the cable end, the contacts configured to be mated with a mating connector plugged into the connector at the mating end, the connector having an end wall in the cavity facing the shoulder; and
a biasing mechanism received in the cavity, the biasing mechanism engaging the connector and forward biasing the connector, with the contacts and the cables, in the cavity, wherein the biasing mechanism has a biasing force exceeding a mating force with the mating connector such that the connector remains forward biased in the cavity during mating with the mating connector, and wherein the biasing mechanism allows the connector to move rearward when the biasing force is exceeded; and
a second panel mount connector assembly terminated to corresponding cables of the cable bundle and configured to be coupled to a second panel.

12. The cable assembly of claim 11, wherein the second panel mount connector assembly is electrically connected to the first panel mount connector assembly.

13. The cable assembly of claim 11, further comprising a third panel mount connector assembly terminated to corresponding cables of the cable bundle, the first and second panel mount connector assemblies both being electrically connected to the third panel mount connector assembly.

14. The cable assembly of claim 11, wherein the second panel mount connector assembly comprises:
a panel mount bracket extending between a front and a rear, the panel mount bracket having a cavity open at the rear, the panel mount bracket having a front opening at the front open to the cavity, the panel mount bracket having a shoulder adjacent the front opening, the panel mount bracket configured to be mounted to the panel;

a connector movably received in the cavity, the connector having a mating end and a cable end, the connector holding contacts at the mating end and having cables terminated to the contacts extending rearward from the cable end, the contacts configured to be mated with a mating connector plugged into the connector at the mating end, the connector having an end wall in the cavity facing the shoulder; and a biasing mechanism received in the cavity, the biasing mechanism engaging the connector and forward biasing the connector in the cavity, wherein the biasing mechanism has a biasing force exceeding a mating force with the mating connector such that the connector remains forward biased in the cavity during mating with the mating connector, and wherein the biasing mechanism allows the connector to move rearward when the biasing force is exceeded.

15. The cable assembly of claim 11, wherein the biasing mechanism compensates for overdrive of the mating connector beyond full mating with the connector allowing the connector to move rearward when the mating connector is in overdrive beyond full mating.

16. The cable assembly of claim 11, wherein the biasing mechanism forward biases the connector until the end wall engages the shoulder to forward position the connector in the cavity.

17. The cable assembly of claim 11, wherein the panel mount bracket has a first flange and a second flange laterally offset to receive a panel between the first flange and the second flange, the panel mount bracket having a flexible mounting arm configured to elastically engage the panel to hold the panel mount bracket against the panel.

18. A communication system comprising:

a rack having a plurality of shelves coupled to the rack, each shelf having a rear panel including a panel cutout and a panel mount connector assembly received in the panel cutout can coupled to the rear panel, the panel mount connector assembly comprising:

a panel mount bracket extending between a front and a rear, the panel mount bracket having a cavity open at the rear, the panel mount bracket having a front opening at the front open to the cavity, the panel mount bracket having a shoulder adjacent the front opening, the panel mount bracket configured to be mounted to the panel;

a connector movably received in the cavity, the connector having a mating end and a cable end, the connector holding contacts at the mating end and having cables terminated to the contacts extending rearward from the cable end, the connector having an end wall in the cavity facing the shoulder; and a biasing mechanism received in the cavity, the biasing mechanism engaging the connector and forward biasing the connector in the cavity; and servers coupled to corresponding shelves, each server having a server host board and a mating connector electrically connected to the server host board, the mating connector being mated to the connector of the corresponding panel mount connector assembly when the server is coupled to the shelf;

wherein the biasing mechanism has a biasing force exceeding a mating force with the mating connector such that the connector remains forward biased in the cavity during mating with the mating connector, the biasing mechanism forward biases the connector until the end wall engages the shoulder to forward position the connector in the cavity; and wherein the biasing mechanism allows the connector to move rearward when the biasing force is exceeded.

19. The communication system of claim 18, wherein the biasing mechanism compensates for overdrive of the mating connector beyond full mating with the connector allowing the connector to move rearward when the mating connector is in overdrive beyond full mating.

20. The communication system of claim 18, wherein the panel mount bracket has a first flange and a second flange laterally offset to receive a panel between the first flange and the second flange, the panel mount bracket having a flexible mounting arm configured to elastically engage the panel to hold the panel mount bracket against the panel.

* * * * *